(12) United States Patent
Kwon

(10) Patent No.: US 7,373,535 B2
(45) Date of Patent: May 13, 2008

(54) ELECTRIC POWER SAVING APPARATUS COMPRISING SEMI-CONDUCTOR DEVICE TO PASS ENERGY OF INFRARED RAY SYNTHETIC WAVELENGTH INTO ELECTRIC CABLE USING OUTPUT PULSE SIGNAL, ELECTRIC CIRCUIT BOARD STRUCTURE FOR IMPLEMENTING THE APPARATUS, AND ELECTRIC POWER SAVING METHOD

(76) Inventor: Young-Dae Kwon, 501, Dongnam Villa 396-5, Beomeo-dong, Suseong-gu, Daegu 706-823 (KR)

( * ) Notice: Subject to any disclaimer, the term of this patent is extended or adjusted under 35 U.S.C. 154(b) by 50 days.

(21) Appl. No.: 11/521,606

(22) Filed: Sep. 15, 2006

(65) Prior Publication Data

US 2007/0247078 A1     Oct. 25, 2007

Related U.S. Application Data

(63) Continuation of application No. PCT/KR2006/001520, filed on Apr. 21, 2006.

(51) Int. Cl.
*G06F 1/32* (2006.01)
*G06F 1/00* (2006.01)

(52) U.S. Cl. .................... 713/320; 713/300

(58) Field of Classification Search ............... 713/300, 713/320, 321, 323; 315/200 R, 206, 207, 315/208
See application file for complete search history.

(56) References Cited

U.S. PATENT DOCUMENTS 4,700,113 A     10/1987   Stupp et al.
6,658,579 B1 *  12/2003   Bell et al. .................... 713/400
6,828,738 B2 *  12/2004   Grinneiser .................... 315/289
7,023,425 B2 *   4/2006   Casebolt et al. ............. 345/163
7,287,175 B2 *  10/2007   Vereen et al. ................ 713/323

FOREIGN PATENT DOCUMENTS

| | | |
|---|---|---|
| JP | 61-150666 | 7/1986 |
| JP | 10-190577 | 7/1998 |
| JP | 01-068275 A | 3/2001 |
| KR | 2000-0039206 A | 7/2000 |
| KR | 2001-0045803 | 7/2000 |
| WO | 03/015249 A1 | 2/2003 |

* cited by examiner

*Primary Examiner*—Tuyet Vo
*Assistant Examiner*—Minh Dieu A
(74) *Attorney, Agent, or Firm*—Miles & Stockbridge P.C.; David R. Schaffer

(57) ABSTRACT

The present invention relates to an electric power saving apparatus wherein light energy is irradiated to a semiconductor device, with the light energy emitted when a voltage is supplied to a transmission line, such that the wavelengths of the electrons on the transmission line, along which a load-driving current flows are elongated, and the spin motions and vibration states of the electrons are stabilized, thereby reducing the collision of electrons in order to reduce the loss of energy, and wherein the light energy irradiated to the semiconductor device is continuously supplied thereto, by the use of an infrared ray emitting diode during operation, thereby maintaining the power saving effects with stability and continuity.

26 Claims, 11 Drawing Sheets

VALENCE ELECTRONS
OR
FREE ELECTRONS

ELECTRIC POWER SAVING APPARATUS COMPRISING SEMI-CONDUCTOR DEVICE TO PASS ENERGY OF INFRARED RAY SYNTHETIC WAVELENGTH INTO ELECTRIC CABLE USING OUTPUT PULSE SIGNAL, ELECTRIC CIRCUIT BOARD STRUCTURE FOR IMPLEMENTING THE APPARATUS, AND ELECTRIC POWER SAVING METHOD

CROSS-REFERENCE TO RELATED APPLICATION

The present application is a Continuation Application of International Application No. PCT/KR2006/001520, filed Apr. 21, 2006, entitled "Electric Power Saving Apparatus Comprising Semi-Conductor Device To Pass Energy Of Infrared Ray Synthetic Wavelength Into Electric Cable Using Output Pulse Signal, Electric Circuit Board Structure For Implementing The Apparatus, And Electric Power Saving Method," which is hereby incorporated herein by reference in its entirety.

TECHNICAL FIELD

The present invention relates to an electric power saving apparatus and method wherein the light energy of infrared ray synthetic wavelengths, passed through an optical filter, that is, of the infrared rays (light) of a specific band, and visible light, is irradiated continuously to and/or on a semi-conductor device in order to supply a pulse micro current form of light energy waves emitted from a semiconductor device to a transmission line, connected from a power source to a load side, such that the wavelengths of electrons are lengthened along the transmission line, through which a current for driving the load flows, with the spin and vibration states of electrons, that is, the motion states of electrons that cause energy loss, stabilized to ensure that collisions among electrons are suppressed, thereby greatly reducing the loss of energy, resulting in the stable operation of an electric power supply system and an excellent electric power saving effect therefrom. The use of "irradiated to" and "irradiated on" throughout this application are used interchangeably and are intended to have substantially the same meaning, for example, but not limited to, shine on, shined on, and the like.

BACKGROUND

Various types of electric power saving apparatus have been proposed and used for an electric circuit, actuating the load of an electric motor, an electric heater, an illuminating device, or the like, by the supply of electric energy from a power source.

FIG. 1 is a circuit diagram and a pulse waveform illustrating an inverter for converting direct current power into alternating current power, as one of the conventional types of electric power saving apparatus. During the first half of a half-cycle, where thyristors 1 and 2 are triggered, the energy accumulated on a load is returned to a power source through respective diodes 3 and 4 and; in the case of an advancing power factor, during the latter half of the half cycle, conversely, diodes 3 and 4 are conductive. This is implementation may be referred to as a power inverter. Thus, frequencies are converted by using the power inverter to control the revolutions per minute, thereby obtaining electric power saving effects.

FIG. 2 is a circuit diagram illustrating a conventional cyclo-converter used as a power converter conducting the frequency conversion of alternating current power, wherein during the frequency converting process, the third and fifth harmonic waves are generated such that a precision machine may malfunction, a motor may suffer a reduced life period or a malfunction, or wave forms may be distorted. In particular, the conventional cycle-converter is not available at the high voltage of approximately 660 volts.

FIG. 3 is a circuit diagram illustrating a series resonant circuit (e.g., but not limited to, a serial resonator) that uses an electronic ballast (or an electronic stabilizer), wherein a series/parallel (or a serial/parallel) resonant type inverter, as embodied in conventional lamps, is adopted. As shown in FIG. 3, Capacitor 5 and Inductor 6 serve to implement the stable lighting of a load lamp, with Capacitor 7 constituting the series resonant circuit and serving to activate the load lamp.

Referring to the functions of the series resonant circuit, a plurality of lamps with properties the same as or different from one another are attached to the single electronic ballast, thereby achieving lighting on the plurality of lamps, and a self-protection function is added to respond appropriately to variations in input voltage and high temperature and moisture levels, thereby preventing the electronic ballast from being destroyed. Further, a back light function is added to provide for the further enhancement of functions. As a result, the formation of an electronic ballast enables the removal of magnetic ballast defects, providing improved electric power saving effects. This allows the size of a magnetic device to be reduced such that a small, light ballast is adopted, and with the recent development of semiconductor devices and switching technologies, a high efficiency of power conversion is made possible at the time of high frequency switching. However, conventional power conversion causes variations in input voltages of DC-DC converters to be suppressed such that, so as to reduce the load of the device, large capacitance is required. Because a relatively large quantity of energy needs to be charged during a short period of time as a result, the current flow becomes greater, and the input current to a rectifier becomes intermittent, thereby causing negative effects on the peripheral devices due to distortion of the input current and the high frequency of the input.

FIG. 4 is a circuit diagram illustrating a conventional power-factor correction (or improvement) circuit, wherein a high efficiency of power conversion is made possible at the time of high frequency switching, and in this case, total high frequency distortion factors (i.e., total harmonics distortion (THD)) are lowered such that a switching power source/supply is operated (or activated) like a resistive load at an input terminal of a rectifier.

Thus, the power-factor correction circuit sets an input current according to the input voltage thereto, in order to make the voltage/current ratios constant, thereby achieving a power factor value of 1; however, when the voltage/current ratios are not constant, displacement of phases or distortion of high frequencies occurs, thus decreasing the power factor value. The reactance of the input impedance of the power factor correction circuit causes the displacement of phases of input currents with respect to the input voltages, decreasing the power factor value, and the distortion of high frequencies means a degree of non-linearity of the input impedance of the power factor correction circuit. Therefore, the variation of the input impedance, as a function of input voltages, causes the distortion of input currents, resulting in a decrement of the power factor, thereby providing a relatively weak power saving effect.

There is provided a transformer type linear pressure device with a capacity of ¹⁄₁₀ as a power saving product for complex loads, which has a first voltage coil and a second current coil, each being wound on a toroidal core. In this case, the first voltage coil is wound with the voltage regulation in five steps and, using a cooperative induction reactor where the first voltage coil and the second current coil are connected in series with each other at the ends thereof in order to provide a series reactor function, AC power is not distorted or damaged at all, controlling the appropriate voltage, current, and input/output quantity. Therefore, the conventional transformer type linear pressure device adopts an improved control means, greatly enhancing the economical advantages and reliability thereof. However, this device is not available for a high capacity and for a high voltage. In addition, the waveforms are distorted by the artificial control of voltages, such that the conventional device is inadequate for precision machinery, and as large-sized machines are adopted, the installation area becomes restricted. On the other hand, in the case of an electric heater, there has not been an effective power saving apparatus until now.

Generally, the loss of energy generated on an electric motor, electric heater, or illuminating lamp operated using electric energy and the loss of energy generated on conductor resistance on a transmission line are caused by the irregular motions of electrons as a result of the application of heat or vibration.

As previously discussed, in the case of conventional types of electric power saving apparatus, there has thus far been no method proposed for controlling the irregular motions of electrons caused by heat or vibration that act as the fundamental cause of energy loss in electric motors, electric heaters, or illuminating lamps powered by electric energy, as well as the energy loss by conductor resistance on a transmission line, such that the conventional types of power saving apparatus provide only somewhat limited power saving effects.

Therefore, the inventor of this invention has provided a novel power saving apparatus and method that solves the problems of conventional types of power saving apparatus, which is disclosed in International Patent Publication Laid-Open No. WO 03/015249 A1, as filed by the inventor of this invention, and which is hereby incorporated herein by reference in its entirety. For the purpose of developing an understanding of the basic technical spirit of the prior art as filed by the inventor of this invention and of the present invention, an explanation of their basic principles will be supplied, with reference to FIGS. 5 to 9.

FIG. 5 is a plane view illustrating the charge distribution in a metal. In FIG. 5, reference numeral 1 denotes electrons that are strongly coupled to the positive charges of an atomic nucleus and to the atomic nucleus, and reference numeral 2 denotes valence electrons, or free electrons, that are moving along the outermost orbit of an atom. Free electrons 2 move freely, and are not coupled to specific atoms. According to electron gas theory, free electrons 2 in the metal collide with relatively heavy ions that are, generally, at a halted state, such that they conduct continuous movements, while changing their advancing direction; at this time, the mean distance moving between the collisions is referred to as a mean free path.

If a constant electric field E (V/m) is applied to the metal, the motions of the free electrons are accelerated, without any collision with the ions, such that as time passes, the accelerated speed is increased enormously; however, due to the collision, free electrons lose their energy and change their advancing directions. At the instant when the free electrons collide against the ions, the accelerating speed is reduced to a value of 0. During normal operation, they have a mean speed, which is referred to as a drift speed.

The energy obtained by the free electrons in the electric field is transmitted to the ions colliding with the free electrons, such that when they are moving in the metal, power consumption results. Also, as the current flows via the movements of the electrons, a number of electrons collide against each other during these movements, such that the energy of the electrons generates heat.

If photons, with the light energy of a specific wavelength range, are poured in (or perhaps more accurately, injected into) the electrons forming a current on a metal conduction line (e.g., but not limited to, a metal wire), the electron wavelengths become long, and their spinning motions or vibrations become stable, thereby reducing the number of collisions among the electrons and eliminating the loss of energy generated by the irregular movements of the electrons, such that a system related to electricity may be stabilized, and electric power saving efficiency can be optimized, based on the inventor's prior patent publication no. WO 03/015249 A1.

For the purposes of developing an understanding of the effects obtained by pouring the photons with the light energy into the electrons moving in to form the electric field that generates the current, an explanation of the various effects caused by the coupling of light and electrons will be provided first. That is to say, a photoelectric effect, or a Compton effect, is to be hereby related.

As illustrated in FIG. 6, if light is irradiated to a metal, electrons are emitted from the surface of electrode A and then enter electrode B, thereby causing a current (I). This is known as the photoelectric effect, and the electrons emitted after the irradiation of light are referred to as photoelectrons. If the kinetic energy T of the photoelectrons is denoted by the function of the frequency ν of incident light, kinetic energy T has a value of 0 when the incident light has a frequency having a given limiting value or less, as outlined in the graph of FIG. 7, with its values increasing linearly in proportion to the frequencies of incident light when the incident light has a frequency of the given limiting value or more.

Furthermore, as illustrated in FIGS. 8 and 9, a phenomenon referred to as the Compton effect occurs between the electrons and the photons. The figures illustrate a phenomenon wherein as X-rays (photons) are irradiated to a material, they radiate by virtue of their colliding against halting electrons (v=0) such that the energy is partially absorbed by the electrons to cause a change to the movement of electrons, as well as a phenomenon wherein the wavelength of the waves of X-rays changes from λ to λ', based upon Einstein's corpuscular theory. Generally, the electrons of an atom occupy the positions with possibly the lowest energy level. When the electrons are arranged on such positions, the atom is at a ground state. However, if one or more electrons are moved to a higher energy level by a given cause (by the application of an electric field, for example, as outlined in the present invention), the atom is in an excited state. The photons can induce the transition between different electron energy levels. If the photons colliding with the electrons have sufficient energy levels, the electrons absorb the energy of the photons to move to a higher energy level. On the other hand, electrons in the excited state collide with the photons to move to a lower energy level, and if the electrons that form the stream of current in the electric field already applied to the transmission line of a power circuit have the light energy (photons) provided by the infrared ray synthetic wavelengths supplied from a semiconductor device, they will have substantially longer wavelengths, meaning their vibration state will be stable, an important basic principle of this invention.

However, according to the inventor's prior patent publication no. WO 03/015249 A1, light energy having the infrared ray synthetic wavelength of a band between 780 mm and 900 mm is irradiated to the semiconductor device constituting the circuit board of the electric power saving apparatus while the circuit board is being assembled, such that the electrons in the valence band absorb the photons and move to the conduction band, thereby forming holes in the valence band. Thus, at a state where the electrical state in the crystal interior of the semiconductor device is varied, the formation of the electric power saving apparatus is completed, and after that, the micro current, which is generated by the application of the low constant voltage rectified from alternating current power to the semiconductor device, is supplied again to the power circuit. According to the inventor's prior patent publication no. WO 03/015249 A1, however, prior to the circuit board of the electric power saving apparatus being finished as one system, the light energy having the infrared ray synthetic wavelength of a specific band range is irradiated to the semiconductor device during the manufacturing process of the semiconductor device, such that until the apparatus is finally able to be used at the state of being connected to the power circuit by a user's manipulation, it is difficult to maintain a good energy state of the semiconductor device. Therefore, the electric power saving effect is not appropriate, and when a given period of time has elapsed, the saving effect may be reduced. Furthermore, the electric power saving apparatus according to the inventor's prior patent publication no. WO 03/015249 A1 does not recognize the reduction of the electric power saving effect well, and as there is no circuit absorbing the surge voltage contained in the alternating current power supplied from a power source, the stability of the electric power saving apparatus while it is in use cannot be ensured. As a result, the inventor of this invention provides herein a novel power saving apparatus that overcomes the problems as described with the prior art.

SUMMARY

Accordingly, the present invention has been developed to solve the aforementioned problems occurring in the prior art, and it is an object of the present invention to provide an electric power saving apparatus using light energy with infrared synthetic wavelengths that is configured so as to reduce the loss of energy due to the heat and high frequencies caused by friction during the motion of electrons in a transmission line, when a current is supplied from alternating current power to an electric load side, that is configured to remove iron, machine, and copper losses to make a system related to electricity permanently stable at a high power saving efficiency, that is configured to absorb surge voltages contained in the alternating current power to make the apparatus stable, and that is configured to display the current state of a circuit of this apparatus to the outside, so that checking whether the apparatus is normally operating or not can be done easily.

To accomplish the aforementioned objectives, according to an aspect of the present invention, there is provided an electric power saving apparatus using light energy having infrared synthetic wavelengths that is connected in parallel with a transmission line connecting alternating current power and a load, and that is provided with a semiconductor device adapted so as to transmit light energy with the infrared ray synthetic wavelengths to the transmission line as an output pulse signal, with the electric power saving apparatus comprising: a rectifying part disposed between the alternating current power and an input terminal of the semiconductor device, for rectifying the alternating current into a direct current of low voltage; a control part, having a circuit adapted so as to apply a driving voltage at the direct low voltage current of the rectifying part to the semiconductor device, and having the semiconductor device; an oscillation-limiting part disposed at a carrier circuit between the transmission line connecting the alternating current power and the load, and an output terminal of the semiconductor device, for making the output pulse signal correspond with the frequency of the alternating current power; and an infrared ray emitting diode disposed near the semiconductor device in such a manner as to be controlled by the output of the control part having the semiconductor device mounted on a circuit board constituting the electric power saving apparatus, for irradiating the infrared rays emitted thereby to the semiconductor device, such that while a circuit board constituting the electric power saving apparatus is being assembled, the light energy from the infrared synthetic wavelengths of a specific wavelength band is irradiated to the semiconductor device to excite electrons absorbing the photons to a conduction band, and to vary the electrical state in the interior of the crystal of the semiconductor device, and while the electric power saving apparatus is being operated after being connected in parallel with the transmission line connecting the alternating current power and the load, the infrared ray energy is continuously supplied to the semiconductor device.

To accomplish the above objective, according to another aspect of the present invention, there is provided a circuit board structure for use in an electric power saving apparatus, which is connected in parallel with a transmission line connecting alternating current power and a load; the electric power saving apparatus including (for example, comprising): a control part and a semiconductor device adapted to transmit the light energy having infrared synthetic wavelengths to the transmission line as an output pulse signal; the circuit board structure, comprising an infrared ray emitting diode disposed near the semiconductor device in such a manner as to be controlled by the output of the control part, having the semiconductor device mounted on a circuit board constituting the electric power saving apparatus, for irradiating the infrared rays emitted therefrom to the semiconductor device, such that while the circuit board for the electric power saving apparatus with the semiconductor device constituting the control part is being assembled, the light energy from the infrared ray synthetic wavelengths of a specific wavelength band is irradiated to the semiconductor device to excite electrons absorbing photons to a conduction band and to vary an electrical state in the crystal interior thereof; and, while the electric power saving apparatus is being operated after being connected in parallel with the transmission line connecting the alternating current power and the load, the infrared ray energy emitted therefrom is continuously supplied to the semiconductor device.

To accomplish the aforementioned objective, according to yet another aspect of the present invention, there is provided an electric power saving method using light energy having infrared synthetic wavelengths, the electric power saving method comprising the following steps: 1) while a circuit board constituting the electric power saving apparatus is being assembled, irradiating the light energy having the infrared synthetic wavelengths of a specific wavelength band to the semiconductor device to excite the electrons absorbing photons to a conduction band, and to vary the electrical state in the interior of the crystal of the semiconductor device; 2) in a state where the circuit board for the electric power saving apparatus is used after assembly, rectifying a high alternating current voltage flowing from alternating current power to a low constant voltage, and supplying the low constant voltage to a control part with the semiconductor device then excited by the light energy having the infrared ray synthetic wavelengths through the input terminals of the control part; 3) transmitting the pulse of micro currents outputted from a first output terminal of the control part to a transmission line connecting the alternating current power and a load to supply electric energy; and 4) irradiating infrared rays generated from an infrared ray emitting diode operated by a control signal of a second output signal of the control part to the semiconductor device.

According to the present invention, there is provided an electric power saving apparatus that is configured so that it maintains the energy state of a semiconductor device at a good state, until the apparatus is finally used at the state of being connected to the power circuit by a user's manipulation, unlike conventional apparatuses wherein prior to the circuit board of the electric power saving apparatus being finished as one system, the infrared synthetic wavelengths of a specific range is injected once during the manufacturing process of the semiconductor device, and is configured so as to release the loss of energy caused by heat and high frequency caused due to the loss of friction generated on the motions of electrons on a transmission line when a current is supplied from alternating current power to an electric load side, that is configured to remove iron, machine, and copper losses to create a system related to electricity permanently stable at a high power saving efficiency rate, that is configured to absorb surge voltages contained in the alternating current power to make this apparatus stable, and that is configured to display the current state on a circuit of this apparatus to the outside to provide for the easy checking of whether this apparatus is operating normally or not.

BRIEF DESCRIPTION OF DRAWINGS

Further objects and advantages of the invention can be more fully understood from the following detailed description, read in reference to the accompanying drawings in which.

DETAILED DESCRIPTION OF THE INVENTION

Figure 10:
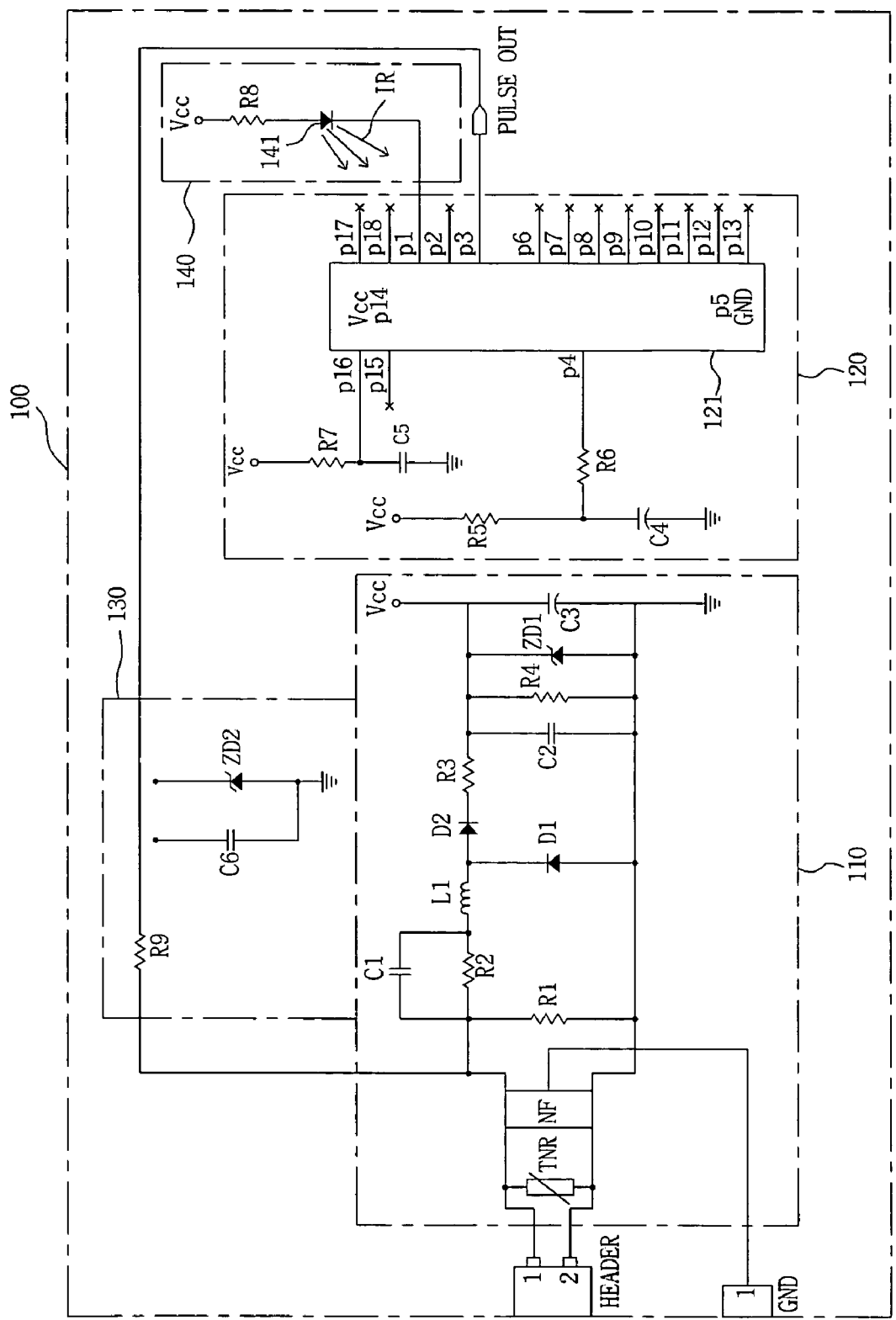
FIG. 10 is a diagram illustrating a circuit constituting a power saving apparatus according to an embodiment of the present invention.
Figure 11:
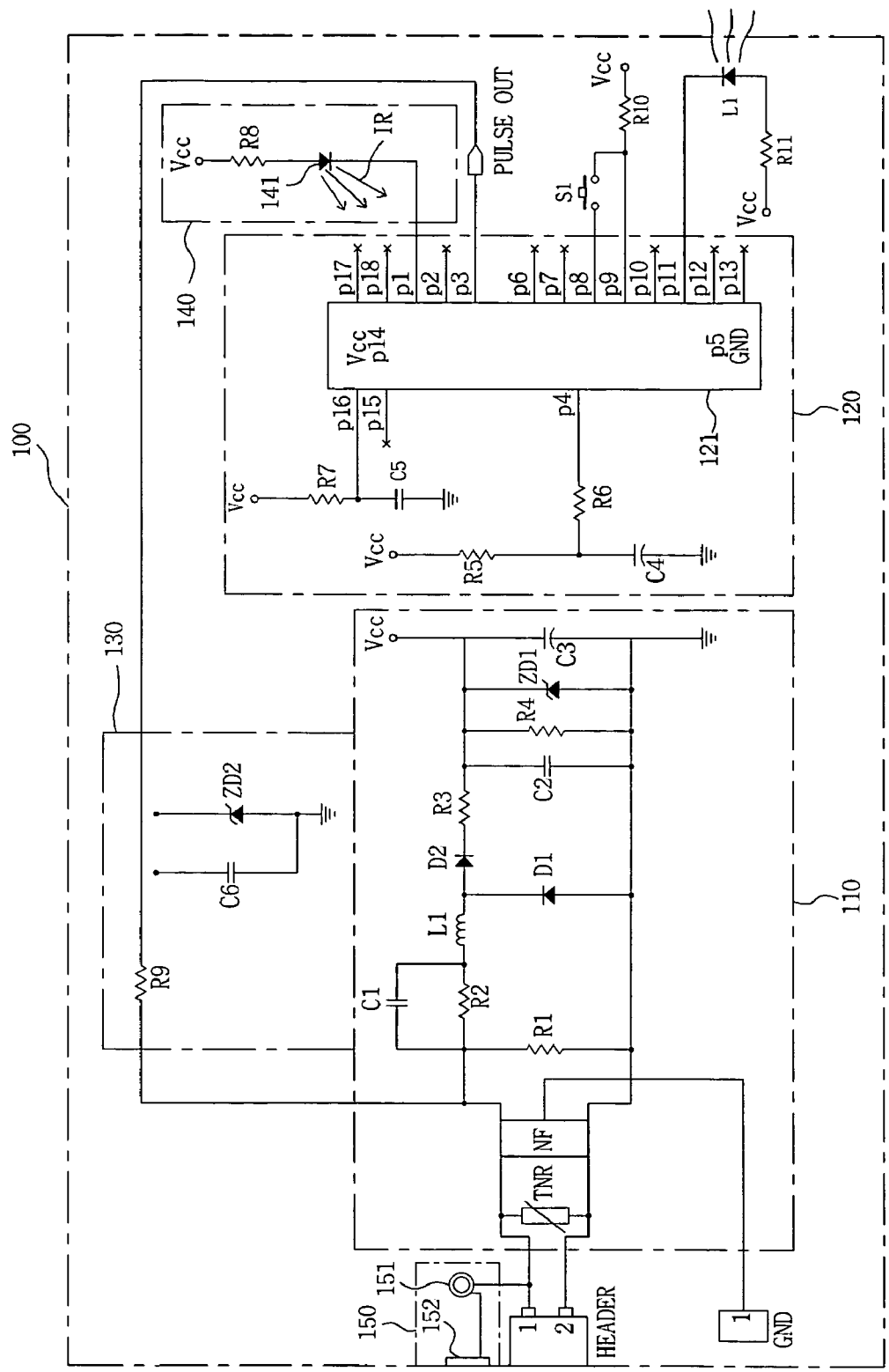
FIG. 11 is a diagram illustrating a circuit constituting a power saving apparatus according to another embodiment of the present invention.
Figure 12:
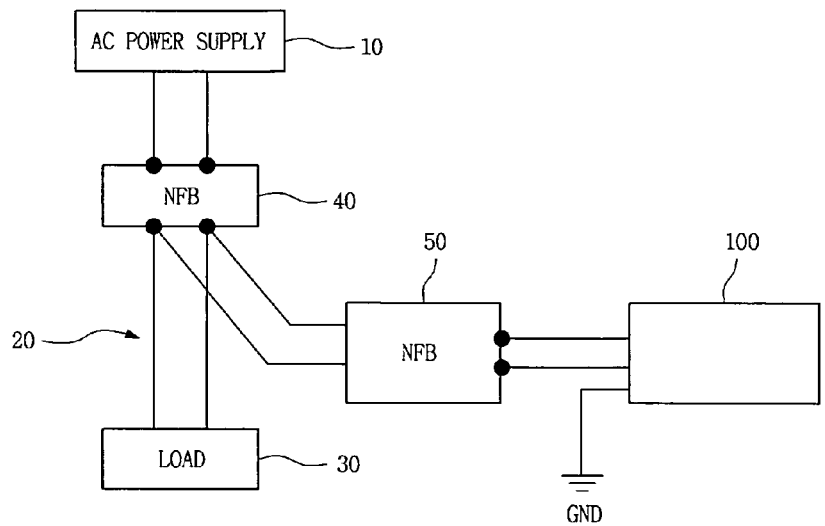
FIG. 12 is a diagram illustrating the electric power saving apparatus of this invention connected to a single-phase power source.
Figure 13:
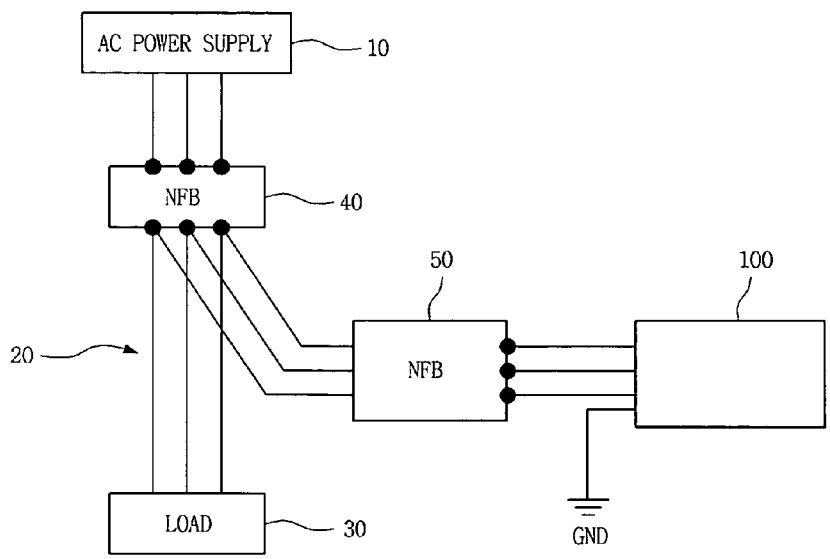
FIG. 13 is a diagram illustrating the electric power saving apparatus of this invention connected to a three-phase power source.

An explanation pertaining to an electric power saving apparatus according to the preferred embodiments of the present invention will be outlined below with reference to the attached drawings. As shown in FIGS. 10 and 11, an electric power saving apparatus 100, according to the present invention, which, as seen in FIGS. 12 and 13, is connected in parallel with a transmission line 20 connecting to an alternating current power supply 10 and a load 30, and in FIG. 10 includes a control unit (e.g., but not limited to, a controller) 120 having a semiconductor device 121 adapted in order to transmit the light energy having infrared ray synthetic wavelengths as an output pulse signal to the transmission line. At this time, electric power saving apparatus 100 is connected through a header in parallel with transmission line 20, connecting alternating current power supply 10 and load 30, with electric power saving apparatus 100 further including a rectifying part (e.g., but not limited to, a rectifier) 110 disposed between a header and an input terminal of the control unit 120 for rectifying the alternating current supplied from alternating current power supply 10, to a direct current of low voltage and an oscillation-limiting part (e.g., but not limited to, an oscillation limiter) 130, disposed at a carrier circuit between an output terminal (e.g., but not limited to, a first output terminal p3) of the semiconductor device 121 and transmission line 20, for the purposes of making the output pulse signal correspond with the frequency of alternating current power supply 10. Furthermore, electric power saving apparatus 100, according to the present invention, includes an infrared ray emitting diode (e.g., but not limited to, an infrared light-emitting device) 140, disposed near semiconductor device 121 in such a manner as to be controlled by the output of control unit 120, having semiconductor device 121 mounted on a circuit board constituting electric power saving apparatus 100, for irradiating infrared rays IR emitted from infrared ray emitting diode 140 to semiconductor device 121, such that while the circuit board constituting electric power saving apparatus 100 is being assembled, the light energy having the infrared ray synthetic wavelengths of a specific wavelength band is irradiated to semiconductor device 121 to excite electrons absorbing photons to a conduction band, and to vary the electrical state in the crystal interior thereof; while electric power saving apparatus 100 is being operated after being connected in parallel with transmission line 20, connecting alternating current power 10 and load 30, infrared ray energy is continuously supplied to semiconductor device 121.

Also, according to electric power saving apparatus 100 of this invention, as illustrated in FIG. 11, a switch S1 is connected additionally to terminals p8 and p9 of semiconductor device 121, in order to check whether semiconductor device 121 is being operated normally or not, by the application of a driving voltage Vcc separately prior to the connection of the alternating current power. That is, if switch S1 is pressed to apply driving voltage Vcc to semiconductor device 121, a light emitting diode L1, connected additionally to a terminal p11, is set to emit a visible light for a predetermined period of time, such that it is checked whether semiconductor device 121, constituting electric power saving apparatus 100 of this invention, is being operated normally or not on an apparatus assembly line. Furthermore, as illustrated in FIG. 11, electric power saving apparatus 100, according to the present invention, preferably includes a current state display part 150, having a current transformer 151 for detecting and reducing the size of the current applied to electric power saving apparatus 100 from the alternating current power to a given ratio at a state where electric power saving apparatus 100 is connected to the alternating current power, and has a liquid crystal display (LCD) 152 for displaying the size of the current detected by current transformer 151 to the outside of the apparatus. As a result, it is established whether, while electric power saving apparatus 100, using the light energy having the infrared ray synthetic wavelengths, is being operated, it is set in a range having a maximum saving efficiency, and whether the size of the current applied to electric power saving apparatus 100 is set in a predetermined range so as to prevent the malfunctioning of electric power saving apparatus 100.

On the other hand, as shown in FIGS. 10 and 11, illustrating each part of the electric power saving apparatus according to the preferred embodiments of the present invention, rectifying part 110 is—desirably—provided with a TNR circuit disposed for absorbing a surge voltage, a noise filter NF, and a constant voltage circuit with a first zener diode ZD1 thereon, and oscillation-limiting part 130 is preferably supplied with a resistor R9, a condenser C6, and a second zener diode ZD2.

Referring in more detail to rectifying part 110 in the circuit diagrams as illustrated in FIGS. 10 and 11, the TNR circuit is a surge-absorbing element used to absorb the surge voltage, contained in the power to create a gentle power flow, with the noise filter NF filtering noises generated by the power. A first resistor R1 interrupts the current flow to give the current an equipotential quality at power-off time, with a first condenser C1 serving as a power supply for the whole circuit, a second resistor R2 serving to protect the condenser C1, an inductor L1 serving to offset the harmonic waves of power, a first diode D1 serving as a half-wave rectifier, and a second diode D2 serving to protect first diode D1 during half-wave rectification. A third resistor R3 serves to conduct power circuit protection and voltage drop, a second condenser C2 serves as a harmonic wave by-pass of the smoothing circuit, a fourth resistor R4 serves to conduct power circuit protection, first zener diode ZD1 generates the constant voltage of 5.6V by using the zener breakdown process, third condenser C3 serves to conduct power smoothing, and driving voltage Vcc is outputted from both ends of third condenser C3.

The driving voltage Vcc is applied as the control signal to semiconductor device 121; that is, to the input terminal of a programmable microcontroller, to control a sixteenth input terminal p16, at which the reset time is adjusted through a seventh resistor R7 and a fifth condenser C5, and to control a fourth input terminal p4, at which reset time is adjusted through a fifth resistor R5, a fourth condenser C4, and a sixth resistor R6.

If a second output terminal p1 is reduced under the control program in semiconductor device 121, infrared ray emitting diode 140, to which the driving voltage Vcc is applied, emits light, and, in contrast, if second output terminal p1 is increased, the current does not flow, thereby extinguishing the infrared ray emitting diode 140. Though only one infrared ray emitting diode 140 is illustrated in FIGS. 10 and 11, a plurality of infrared ray emitting diodes may be mounted; this would partially include visible light-emitting diodes.

Furthermore, a pulse, for example, but not limited to, a square wave pulse, is output from a first output terminal p3 in accordance with the control program of semiconductor device 121, and, desirably, it has the same frequency as the input alternating current power. Additionally, together with the light energy with infrared ray synthetic wavelengths, applied to semiconductor device 121, the pulse is applied to transmission line 20 between alternating current power supply 10 and load 30, as illustrated in FIG. 12 (which illustrates a connection diagram between the single-phase power and the load), through a ninth resistor R9, a sixth condenser C6, and second zener diode ZD2 of the oscillation-limiting part 130 as illustrated in FIGS. 10 and 11. FIGS. 12 and 13, on the other hand, illustrate the connected structure in which electric power saving apparatus 100 of this invention is connected in parallel with transmission line 20 between alternating current power supply 10 and load 30, during the time alternating current power supply 10 is being used for the single-phase power (which is used, as outlined in FIG. 12, for home load devices, such as motors, air conditioners, electric fans, refrigerators, washing machines, television sets, computers, etc), and when alternating current power supply 10 is used for the three-phase power (which is used, as outlined in FIG. 13, for industrial load devices, such as many kinds of motors, coolers, blowers, compressors, air conditioners, pumps, etc). As illustrated, a first electric leak breaker 40 (i.e., a fuse less breaker, also known as a no fuse breaker (NFB)) is disposed on transmission line 20 between alternating current power supply 10 and load 30, and further, a second electric leak breaker 50 (i.e., a fuse less breaker, i.e., an NFB) is disposed at the inside or the outside of electric power saving apparatus 100, connected in parallel with load 30 through the output terminals of first electric leak breaker 40.

Moreover, the infrared ray synthetic wavelengths of a specific band, for example, of a band between 780 mm and 900 mm, are desirably to be provided for (i.e., irradiated on) semiconductor device 121, both prior to and after semiconductor device 121 is assembled, with the infrared ray synthetic wavelengths of bands between 780 mm and 900 mm being obtained from the formation of infrared ray eddy currents by an infrared ray screw, between the visible light of a band between 500 mm and 600 mm, obtained by adjusting its light strength with the use of a visible light filter, and the infrared rays of a band between 1,000 mm and 10,000 mm, obtained by adjusting the light strength with the use of an infrared ray filter.

In this case, semiconductor device 121 is formed by selecting oxide, sulfide, selenide, telluride, halide, and so on, and more preferably, semiconductor device 121 is comprised of a PLZT with a chemical equation of $(Pb_{1-x}La_x)(Zr_{1-y}Ti_y)_{1-x/4}O_3$, which has a significant strong light life period. To achieve improved light energy scanning effects, semiconductor device 121 is packaged with a ceramic material, and in particular, light energy is desirably irradiated to semiconductor device 121 prior to packaging.

Figure 17:
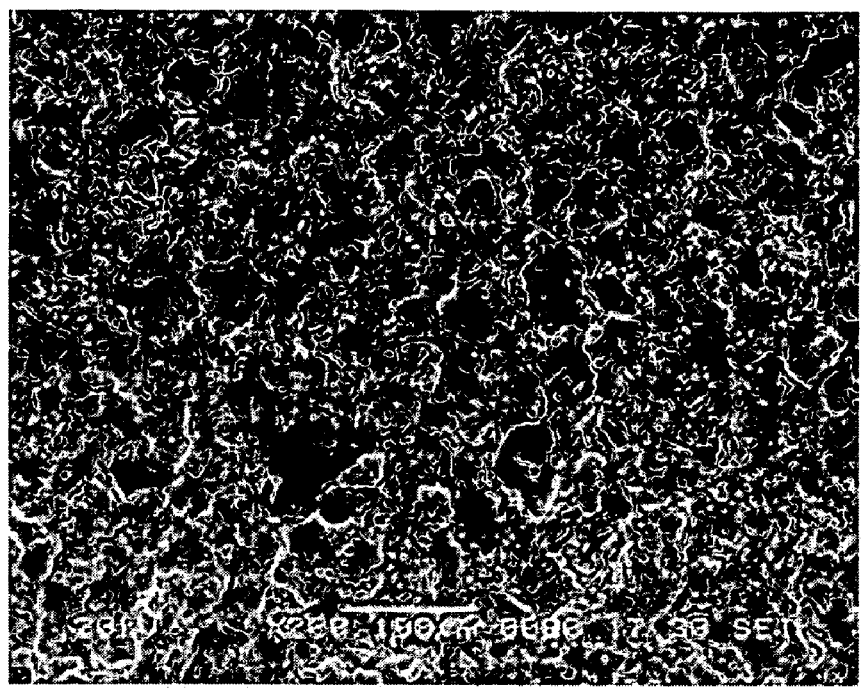
FIGS. 17 and 18 are SEM photographs depicting the variations of physical properties prior to and after the light energy of infrared ray synthetic wavelengths is irradiated to a semiconductor device.
Figure 18:
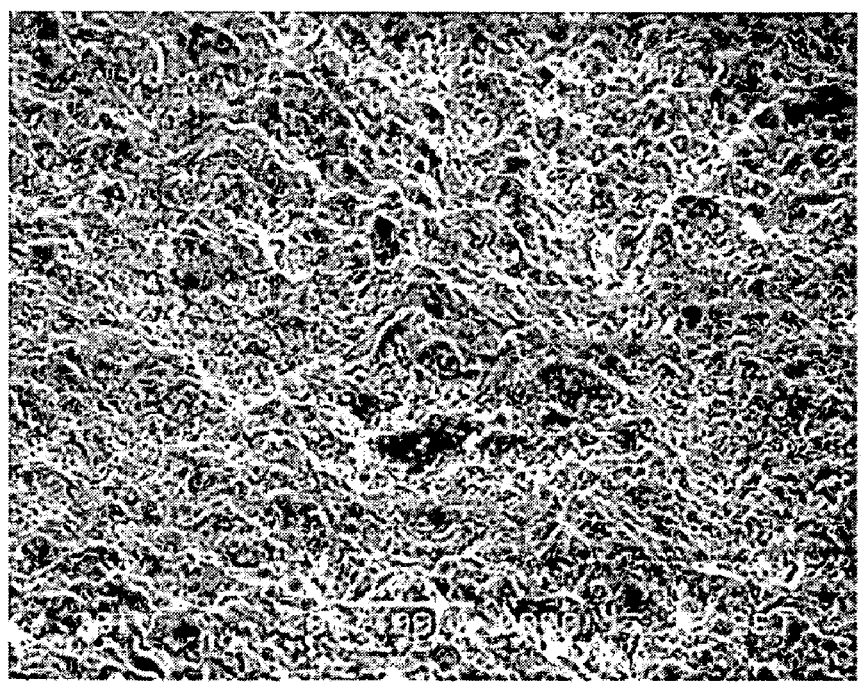

As can be appreciated from the SEM photographs as illustrated in FIGS. 17 and 18, variations of the physical properties are designed prior to and after the light energy of the infrared ray synthetic wavelengths is irradiated to semiconductor device 121; this being due to the variations of the electrical state of the crystal interior of semiconductor device 121.

As previously mentioned, semiconductor device 121 in control part 120 of electric power saving apparatus 100, according to the present invention, is comprised of the microcontroller that is programmed to possess control functions, with the logic of selecting the size of the current of the pulse output to transmission line 20, connecting alternating current power supply 10 and load 30, in addition to the logic of controlling the light-emitting timing of infrared ray emitting diode 140, such that the infrared ray emitting diode 140 may be controlled to maintain the emission of light while electric power saving apparatus 100 is in operation, while otherwise, it can be controlled to repeatedly conduct the emission and extinction of light over a given period of time.

Prior to infrared ray emitting diode 140 being assembled on the circuit board for electric power saving apparatus 100, the light energy from the infrared ray synthetic wavelengths of the specific wavelength band is irradiated to infrared ray emitting diode 140 in order to excite photon-absorbing electrons to a conduction band, and to vary the electrical state in the crystal interior of infrared ray emitting diode 140. Of course, after infrared ray emitting diode 140 is assembled on the circuit board for electric power saving apparatus 100, the light energy, having the infrared ray synthetic wavelengths of the specific wavelength band, is irradiated to infrared ray emitting diode 140, while otherwise, only after infrared ray emitting diode 140 is assembled on the circuit board for electric power saving apparatus 100 is the light energy having the infrared ray synthetic wavelengths of the specific wavelength band irradiated to infrared ray emitting diode 140 in order to excite photon-absorbing electrons to a conduction band, and to vary the electrical state in the crystal interior of infrared ray emitting diode 140. Of course, the infrared ray synthetic wavelengths irradiated to infrared ray emitting diode 140 preferably have a band between 780 mm and 1100 mm, and more preferably have a band between 780 mm and 900 mm; and in the same manner as semiconductor device 121, the infrared ray synthetic wavelengths of bands between 780 mm and 900 mm are obtained by the formation of infrared ray eddy currents by an infrared ray screw between the visible light of a band between 500 mm and 600 mm, obtained by adjusting the light strength by the use of a visible light filter, with the infrared rays of a band between 1,000 mm and 10,000 mm, also obtained by adjusting the light strength by using an infrared ray filter.

Figure 19:
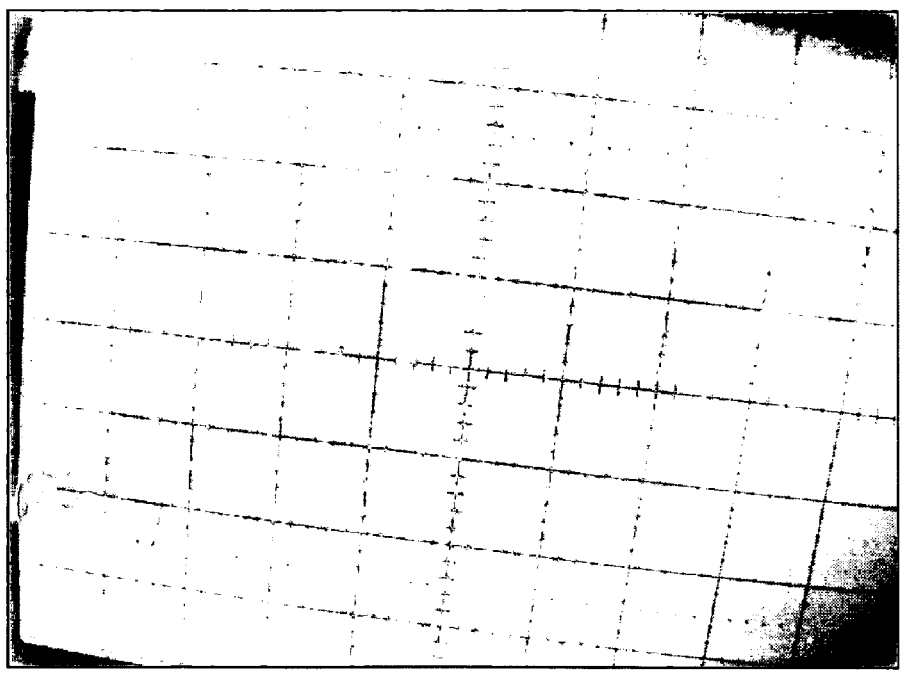
FIGS. 19 and 20 are photographs depicting the voltage states on the transmission line of a conductor on a load side being measured by an oscilloscope, when the electric power saving apparatus of this invention is not adopted, and when it is adopted.
Figure 20:
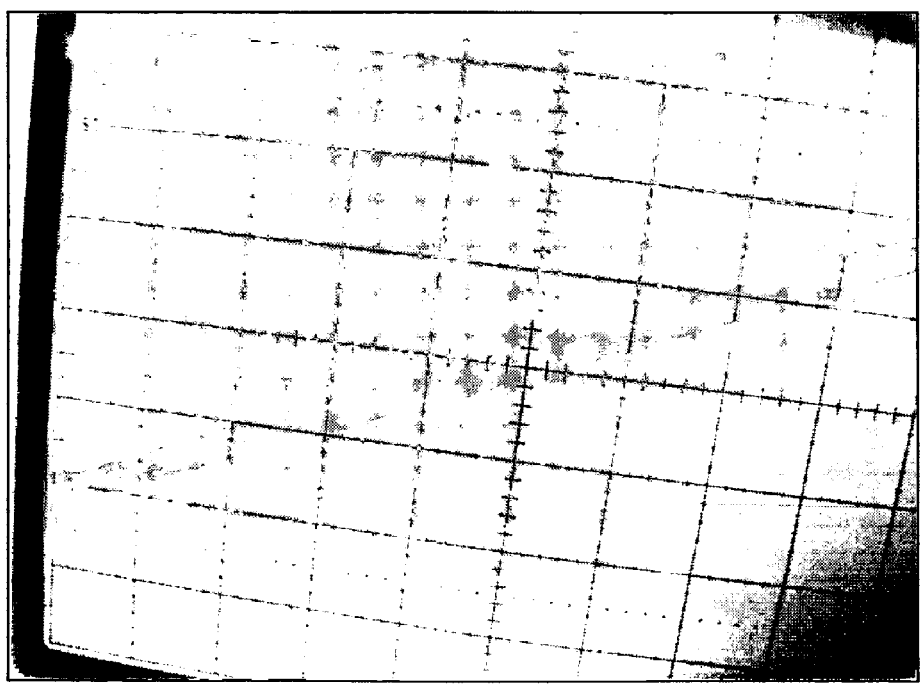

By using electric power saving apparatus 100, according to the present invention, the currents (electrons) flowing along transmission line 20, connected from alternating current power supply 10 to load 30, ensure a stability of spins by virtue of the supply of light energy (photons) from semiconductor device 121, such that the wavelengths of the electrons among all the currents supplied to load 30 become elongated, with the spin motions of the electrons then becoming stable, and the deviation of the electrons from their orbits is thereby prevented by inducing the correction of orbits, thereby reducing a loss of energy and frictional force caused by the collision of electrons, further generating decreases in electromagnetic waves. These effects may be appreciated by comparing the photograph where the voltage states of the conductor transmission line at the load side are measured by means of an oscilloscope, in cases where electric power saving apparatus 100 of this invention is not adopted in the power circuit as illustrated in FIG. 19, with the photograph where the voltage states of the conductor transmission line at the load side are measured by means of an oscilloscope, in cases where electric power saving apparatus 100 of this invention is adopted in the power circuit as illustrated in FIG. 20.

Figure 14:
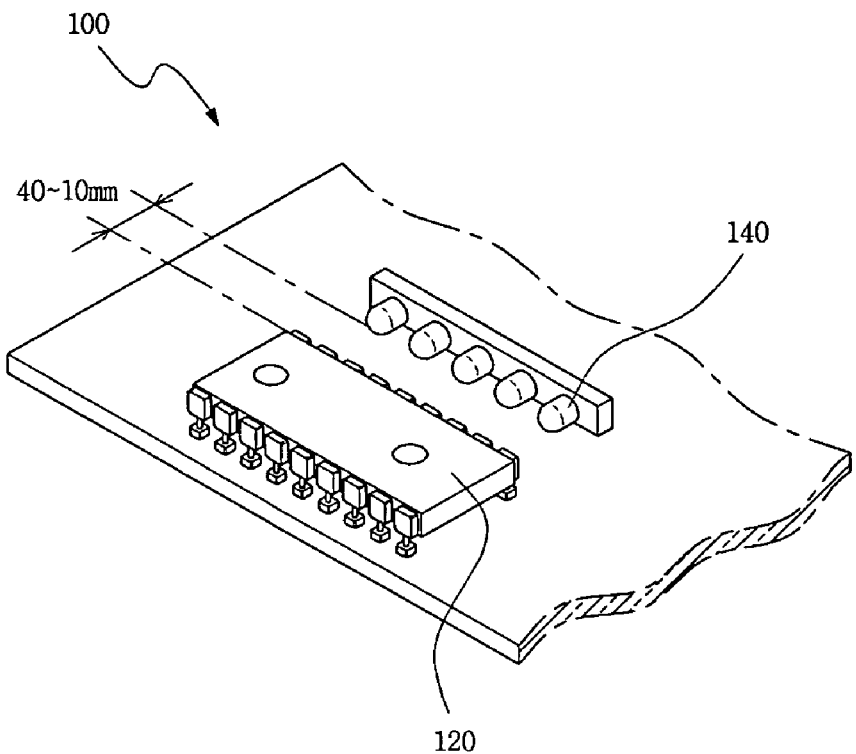
FIG. 14 is a view illustrating an example of a circuit board constituting the electric power saving apparatus of this invention.
Figure 15:
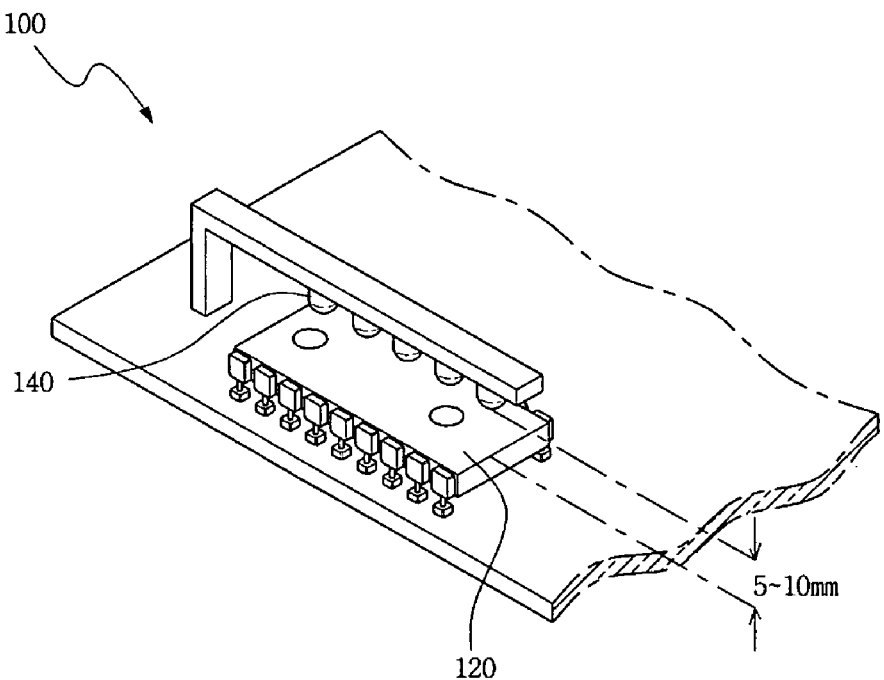
FIG. 15 is a view illustrating another example of the circuit board constituting the electric power saving apparatus of this invention.

As previously mentioned, FIGS. 14 and 15 illustrate examples of the circuit board structure, constituting electric power saving apparatus 100 according to the present invention, wherein the circuit board structure for use in electric power saving apparatus 100, connected in parallel with transmission line 20 and connecting alternating current power supply 10 and load 30, the electric power saving apparatus 100, including control part 120 and semiconductor device 121, adapted to transmit light energy, and having the infrared ray synthetic wavelengths to transmission line 20 as an output pulse signal, the circuit board structure, including infrared ray emitting diode 140 disposed near semiconductor device 121 in such a manner as to be controlled by the output of control part 120, having the semiconductor device mounted on a circuit board, constituting the electric power saving apparatus, for continuously irradiating infrared rays IR emitted therefrom to semiconductor device 121, having the light energy emitted from the infrared ray synthetic wavelengths of a specific wavelength band irradiated thereto, such that while the circuit board for electric power saving apparatus 100, having semiconductor device 121, constituting control part 120, is being assembled, the light energy from the infrared ray synthetic wavelengths of a specific wavelength band is irradiated to the semiconductor device 121, in order to excite photon-absorbing electrons to a conduction band and to vary the electrical state in the crystal interior thereof; and while electric power saving apparatus 100 is being operated after being connected in parallel with transmission line 20, connecting alternating current power 10 and load 30, the infrared ray energy emitted therefrom is continuously supplied to semiconductor device 121. In particular, as illustrated in FIG. 14, infrared ray emitting diode 140 is disposed at the side of semiconductor device 121 on the same plane as the circuit board where semiconductor device 121 is placed (in FIG. 14, infrared ray emitting diode 140 is disposed at the side of the input/output terminals of semiconductor device 121, although this arrangement may be altered), and in this case, when temperature stability of the circuit and appropriate energy efficiency are considered, infrared ray emitting diode 140 is desirably disposed at a distance of between 4 mm and 10 mm from the side of semiconductor device 121.

Furthermore, as illustrated in FIG. 15, infrared ray emitting diode 140 is disposed at the side of semiconductor device 121 on a different plane from the circuit board, where semiconductor device 121 is placed, and in this case, when temperature stability of the circuit and appropriate energy efficiency are considered, infrared ray emitting diode 140 is desirably disposed at a distance between 5 mm and 10 mm from the top surface of semiconductor device 121. On the other hand, although not shown in the diagrams, infrared ray emitting diode 140 may be disposed near one of the side or top surface of semiconductor device 121, and a visible light emitting diode may be disposed near the other. During this time, a single infrared ray emitting diode may be disposed at the side or top surface of semiconductor device 121, unlike the plurality of the infrared ray emitting diodes disposed as per FIGS. 14 and 15.

Figure 16:
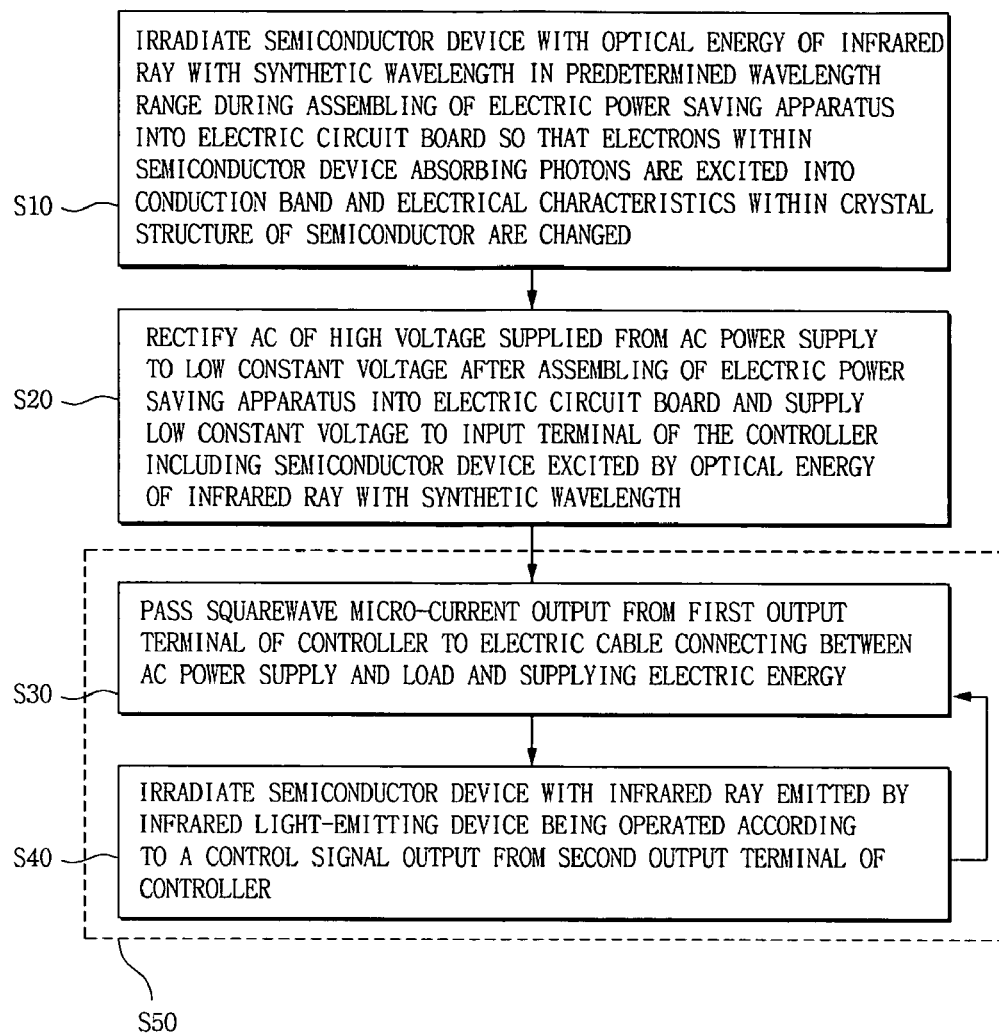
FIG. 16 is a flow chart illustrating a power saving method according to the present invention.

Furthermore, there is provided an electric power saving method using light energy, with infrared ray synthetic wavelengths, as illustrated in FIG. 16; the electric power saving method includes the steps of: 1) while a circuit board constituting electric power saving apparatus 100 is being assembled, irradiating the light energy with the infrared ray synthetic wavelengths of a specific wavelength band to semiconductor device 121 in order to excite photon-absorbing electrons to a conduction band and to vary the electrical state in the crystal interior thereof (at step S10); 2) in a state wherein the circuit board for the electric power saving apparatus is being utilized after assembly, rectifying a high alternating current voltage flowing from alternating current power supply 10 to a low constant voltage, and thereby supplying a low constant voltage to control part 120 with semiconductor device 121 excited by the light energy of the infrared ray synthetic wavelengths through the input terminals of control part 120 (at step S20); 3) transmitting the pulse of micro currents output from first output terminal p3 of control part 120 to transmission line 20, and connecting alternating current power supply 10 and load 30 in order to supply electric energy (at step S30); and 4) irradiating infrared rays generated from infrared ray emitting diode 140, and operated by a control signal of second output terminal p1 of control part 120 to semiconductor device 121 (at step S40).

In this case, of course, steps S30 and S40 may be conducted at the same time at step S50, and at step S40, the light-emitting timing of infrared ray emitting diode 140 is controlled by way of the control of semiconductor device 121, such that it is able to repeatedly conduct the emission and extinction of light for a given period of time, thereby preventing the temperature of semiconductor device 121 from rising excessively.

Figure 1:
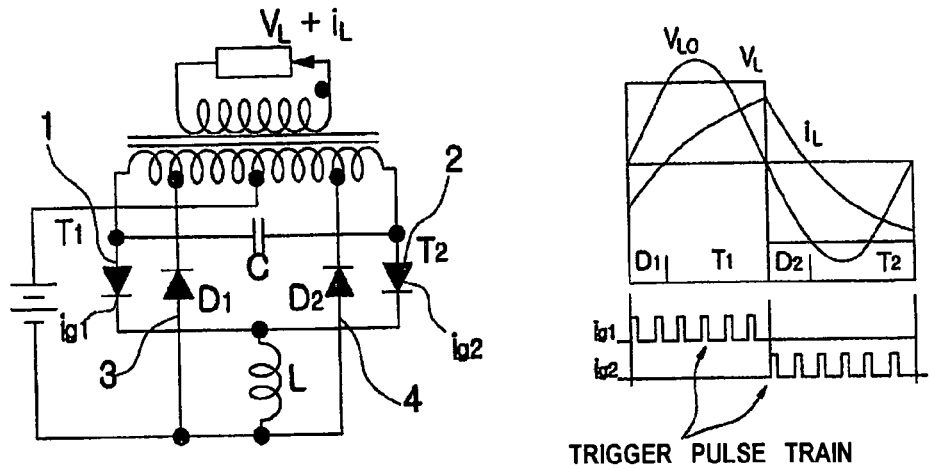
FIG. 1 is a circuit diagram and a pulse wave form illustrating an inverter for converting direct current power into alternating current power, as one of the conventional types of electric power saving apparatus.
Figure 2:
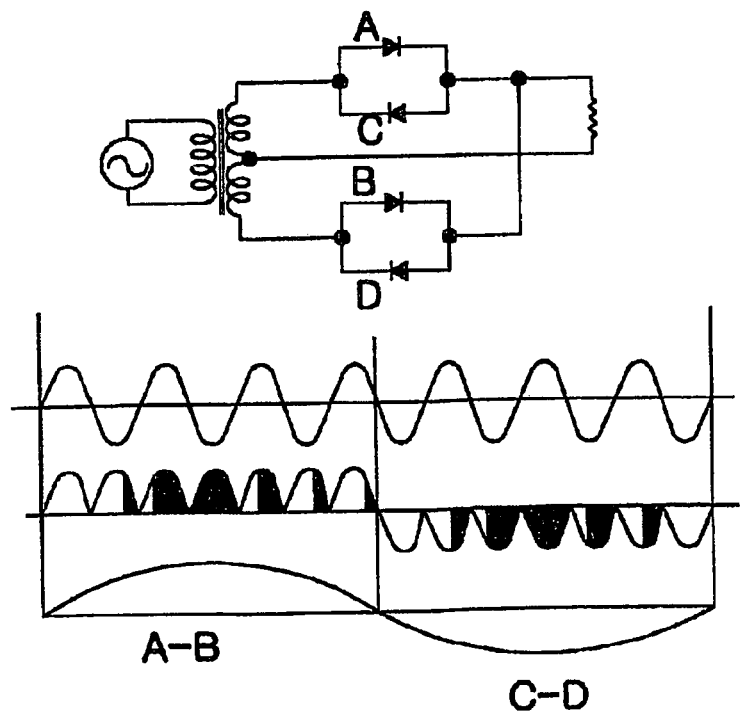
FIG. 2 is a circuit diagram illustrating a conventional cyclo-converter, used as a power converter, conducting the frequency conversion of alternating current power.
Figure 3:
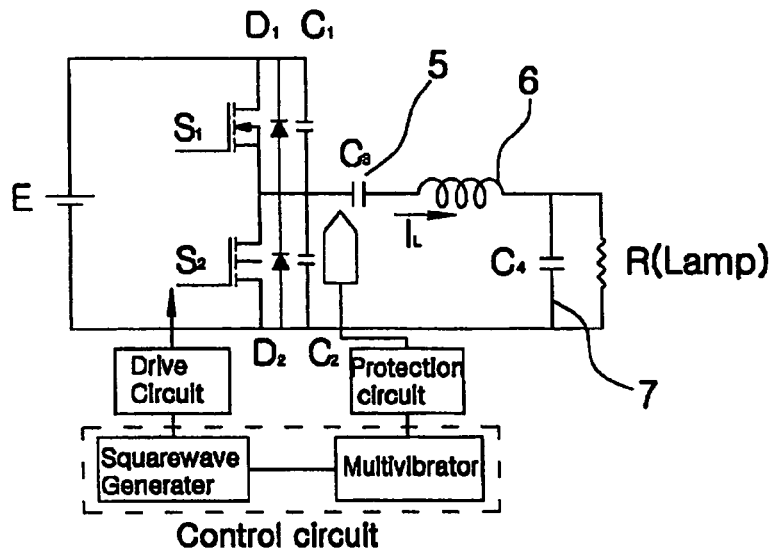
FIG. 3 is a diagram illustrating a series resonant circuit using an electronic ballast, wherein a series/parallel resonant type inverter, as embodied in conventional lamps, is adopted.
Figure 4:
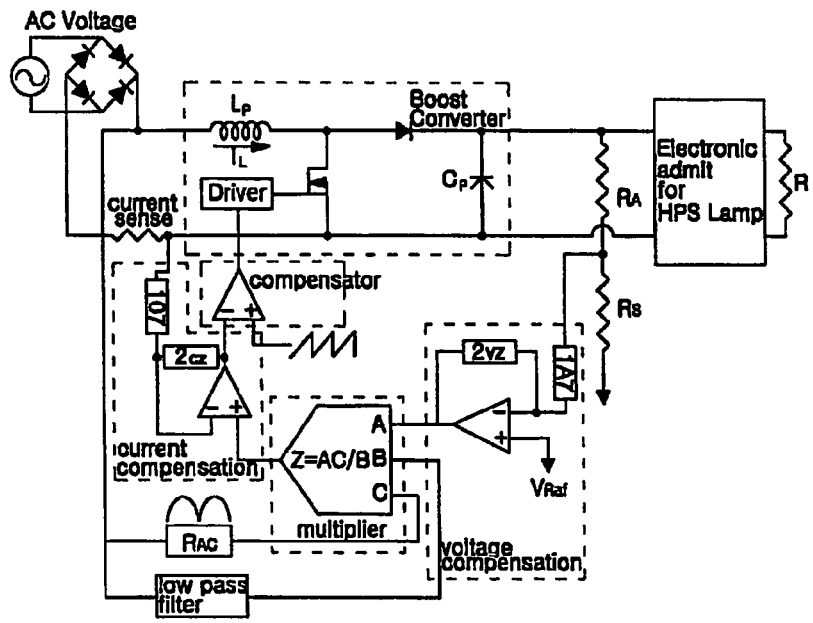
FIG. 4 is a circuit diagram illustrating a conventional power factor correction circuit, wherein a high efficiency of power conversion is possible at the time of high frequency switching.
Figure 5:
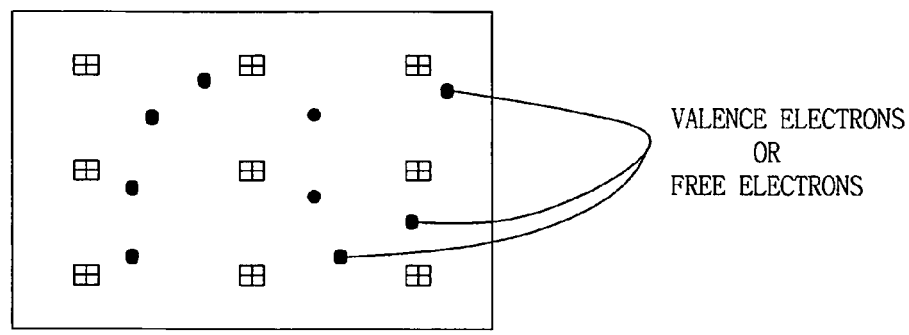
FIG. 5 is a plane view illustrating the charge distribution in a metal.
Figure 6:
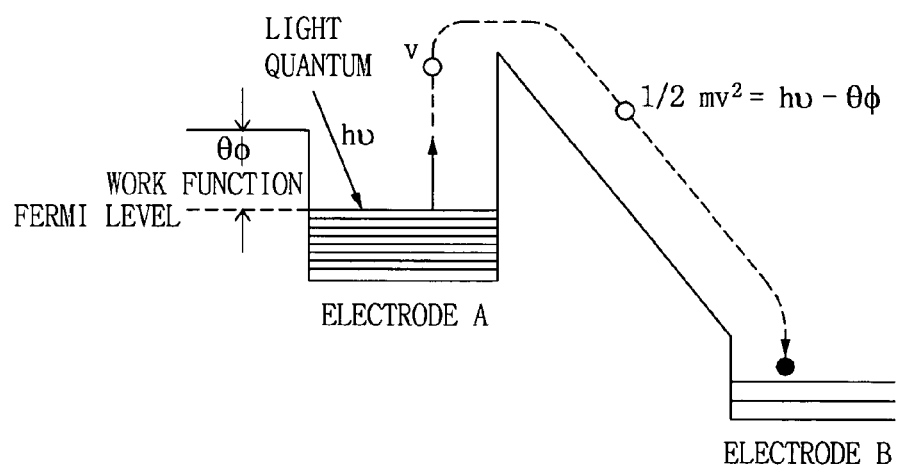
FIG. 6 is a view illustrating the concept of a photoelectric effect.
Figure 7:
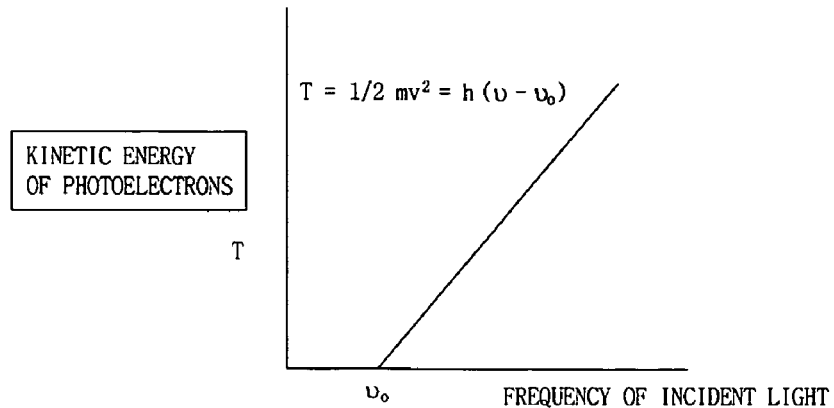
FIG. 7 is a graph illustrating the relation between the kinetic energy of the photoelectrons and the frequencies of incident light.
Figure 8:
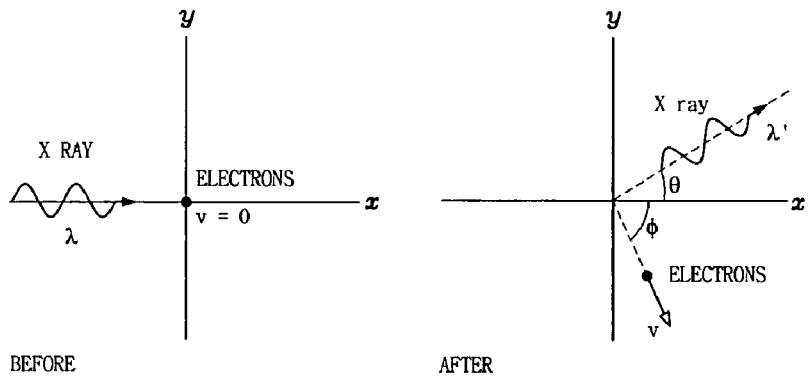
FIGS. 8 and 9 are views illustrating the concept of a Compton effect.
Figure 9:
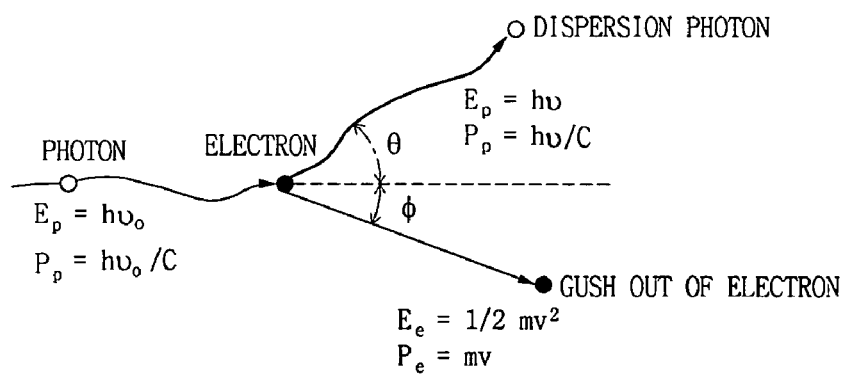

Although in FIG. 9, step S20 further includes the step of reducing and detecting the size of the current applied to the electric power saving apparatus at a given ratio, and displaying the detected size of the current to the outside, which is conducted by current state display part 150 of the electric power saving apparatus, as illustrated in FIG. 11, so that it is easily checked from the outside of electric power saving apparatus 100 whether electric power saving apparatus 100 is set in a range of a maximum saving efficiency, and whether an operational malfunction occurs on electric power saving apparatus 100.

In accordance with an embodiment of the present invention, an electric power saving apparatus including a semiconductor device in a controller coupled in parallel to an electric cable connecting an alternating current (AC) power supply with a load, the semiconductor device passing optical energy of an infrared ray with synthetic wavelength to the electric cable using a square wave output signal, the apparatus comprising: a rectifier that is disposed between the AC power supply and an input terminal of the semiconductor device and rectifies an alternating current(AC) supplied from the AC power supply to a direct current (DC) of low driving voltage; a controller including a circuit applying the DC low driving voltage from the rectifier to the semiconductor device and the semiconductor device in which electrons absorbing photons are excited into a conduction band and electrical characteristics within the crystal structure of the semiconductor are changed by emitting optical energy of an infrared ray synthetic wavelength in a predetermined wavelength region on the semiconductor device during assembling the semiconductor device into the electric circuit board for implementing the electrical power saving apparatus; an oscillation limiter that is disposed in a optical energy passing cable between the electric cable and an output terminal of the semiconductor device and makes the frequency of the square wave output signal equal to the frequency of the AC power; and an infrared light-emitting device that is disposed near the semiconductor device and emits infrared light on the semiconductor device with being controlled by the output of the controller, wherein the infrared light-emitting device irradiate infrared ray on the semiconductor device during the operating time of the electrical power saving apparatus so that the optical energy of infrared ray is continuously provided to the semiconductor device.

In accordance with an embodiment of the present invention, the previous apparatus, wherein the rectifier is a constant-voltage circuit including a TNR circuit, a noise filter, and a Zener diode.

In accordance with embodiments of the present invention, for either of the previous apparatus, wherein the oscillation limiter comprises a resistor, a condenser, and a Zener diode.

In accordance with embodiments of the present invention, for either of the first two apparatus, further comprising a current status indicator including a current transformer reducing the magnitude of applied current by a predetermined ratio for detection and a LCD (Liquid Crystal Display) displaying the magnitude of current detected by the current transformer.

In accordance with embodiments of the present invention, for any of the previous apparatus, wherein the semiconductor device is irradiated by the infrared ray synthetic wavelength of 780 nm to 900 nm.

In accordance with an embodiment of the present invention, the previous apparatus, wherein the semiconductor device is irradiated by the infrared ray synthetic wavelength before being packaged.

In accordance with embodiments of the present invention, for any of the previous apparatus, wherein the infrared ray synthetic wavelength of 780 nm to 900 nm irradiated on the semiconductor device is obtained by combining together visible light of 500 to 600 nm and infrared light of 1,000 to 10,000 nm obtained by adjusting light intensity using a visible light filter and an infrared filter, respectively, by generating an infrared vortex using an infrared screw.

In accordance with embodiments of the present invention, for the first apparatus, wherein the semiconductor device includes a compound selected from the group consisting of oxide, sulfide, selenide, telluride, and halide.

In accordance with embodiments of the present invention, for any of the previous apparatus, wherein the semiconductor device includes a lead titanate zirconate containing lanthanum (PLZT) represented by the formula $(Pb_{1-x}La_x)(Zr_{1-y}Ti_y)_{1-x/4}O_3$.

In accordance with embodiments of the present invention, for any of the previous apparatus, wherein the semiconductor device is ceramic packaged.

In accordance with embodiments of the present invention, for any of the previous apparatus, wherein the semiconductor device is a programmable microcontroller including a logic selecting the magnitude of the output square wave current signal and a logic controlling the timing of light emission from the infrared light-emitting device.

In accordance with embodiments of the present invention, for any of the previous apparatus, wherein a switch and a light-emitting device are additionally coupled to the semiconductor device and check the operation state of the semiconductor device using a driving voltage separately applied before the semiconductor device is connected to the AC power supply.

In accordance with embodiments of the present invention, for any of the previous apparatus, wherein the infrared light-emitting device is irradiated by the optical energy of the infrared ray synthetic wavelength in the predetermined wavelength region before being assembled into the electric circuit board so that electrons absorbing photons are excited into a conduction band and electrical characteristics within the crystal structure of the semiconductor are changed.

In accordance with embodiments of the present invention, for the previous apparatus, wherein the infrared light-emitting device is irradiated by the optical energy of the infrared ray synthetic wavelength in the predetermined wavelength region after being assembled into the electric circuit board.

In accordance with embodiments of the present invention, for any of the previous apparatus, wherein the infrared light-emitting device is irradiated by the optical energy of the infrared ray synthetic wavelength in the predetermined wavelength region after being assembled into the electric circuit board so that electrons absorbing photons are excited into a conduction band and electrical characteristics within the crystal structure of the semiconductor are changed.

In accordance with embodiments of the present invention, for any of the previous apparatus, wherein the infrared light-emitting device is irradiated by the infrared ray synthetic wavelength of 780 nm to 1,100 nm.

In accordance with embodiments of the present invention, for any of the previous apparatus, wherein the infrared light-emitting device is irradiated by the infrared ray synthetic wavelength of 780 nm to 900 nm.

In accordance with embodiments of the present invention, for any of the previous apparatus, wherein the infrared ray synthetic wavelength irradiated on the infrared light-emitting device is obtained by combining together visible light of 500 to 600 nm and infrared light of 1,000 to 10,000 nm obtained by adjusting light intensity using a visible light filter and an infrared filter, respectively, by generating an infrared vortex using an infrared screw.

In accordance with another embodiment of the present invention, an electric circuit board structure implementing an electric power saving apparatus including a semiconductor device in a controller coupled in parallel to an electric cable connecting an alternating current (AC) power supply with a load, the semiconductor device passing optical energy of an infrared ray synthetic wavelength to the electric cable using a square wave output signal, wherein an infrared light-emitting device controlled by the output of the controller is disposed near the semiconductor device so as to continuously provide the optical energy of infrared light on the semiconductor device in which electrons absorbing photons generated by emitting optical energy of an infrared ray synthetic wavelength in a predetermined wavelength region during assembling of the electric circuit board are excited into a conduction band and electrical characteristics within the crystal structure of the semiconductor changed.

In accordance with some embodiments of the present invention, for the previous electric circuit board structure, wherein the infrared light-emitting device is disposed in the same plane as a substrate on which the semiconductor device is positioned and separated from a side surface of the semiconductor device by a distance of 4 to 10 mm.

In accordance with some embodiments of the present invention, for the previous electric circuit board structure, wherein the infrared light-emitting device is disposed in a different plane from the substrate on which the semiconductor device is positioned and is separated from a top surface of the semiconductor device by a distance of 5 to 10 mm.

In accordance with some embodiments of the present invention, for any of the previous electric circuit board structures, wherein the infrared light-emitting device is disposed adjacent to one of a side and a top surface of the semiconductor device and a visible light-emitting device is disposed adjacent to the other one of the two surfaces.

In accordance with still another embodiment of the present invention, an electric power saving method using optical energy of an infrared ray synthetic wavelength, the method comprising: irradiating a semiconductor device in a controller with the optical energy of the infrared ray synthetic wavelength in a predetermined wavelength range during assembling of an electric power saving apparatus into an electric circuit board so that electrons within the semiconductor device absorbing photons are excited into a conduction band and electrical characteristics within the crystal structure of the semiconductor are changed; rectifying an alternating current (AC) of high voltage supplied from the an AC power supply to a direct current (DC) of low constant voltage after assembling of the electric power saving apparatus into the electric circuit board and supplying the low constant voltage to an input terminal of the controller including the semiconductor device excited by the optical energy of the infrared ray synthetic wavelength; passing a square wave micro-current output from a first output terminal of the controller to a optical energy passing cable between an output terminal of the semiconductor device and a optical energy passing cable connecting an alternating current (AC) power supply with a load; and irradiating the semiconductor device with an infrared ray emitted by an infrared light-emitting device being operated according to a control signal output from a second output terminal of the controller.

In accordance with an embodiment of the present invention, for the previous method, wherein the passing of the square wave micro-current and the irradiating of the semiconductor device with the infrared ray are simultaneously performed.

In accordance with some embodiments of the present invention, for any of the previous methods, wherein the irradiating of the semiconductor device with the infrared ray is performed by controlling the timing of light emission from the infrared light-emitting device according to the control of the semiconductor device.

In accordance with some embodiments of the present invention, for any of the previous methods, wherein the rectifying of the AC high voltage to the DC low constant voltage in order to supply the same to the input terminal of the controller further comprises reducing the magnitude of current being applied to the electric current saving apparatus by a predetermined ratio for detection and externally displaying the detected magnitude of current.

In accordance with an embodiment of the present invention, an electric power saving apparatus including a semiconductor device in a controller coupled in parallel to an electric cable connecting an alternating current (AC) power supply with a load, the semiconductor device passing optical energy of an infrared ray with synthetic wavelength to the electric cable using a square wave output signal, the apparatus comprising: means for rectifying that is disposed between the AC power supply and an input terminal of the semiconductor device to rectify an alternating current(AC) supplied from the AC power supply to a direct current (DC) of low driving voltage; means for controlling including a circuit to apply the DC low driving voltage from the rectifier to the semiconductor device and the semiconductor device in which electrons absorbing photons are excited into a conduction band and electrical characteristics within the crystal structure of the semiconductor are changed by emitting optical energy of an infrared ray synthetic wavelength in a predetermined wavelength region on the semiconductor device during assembling the semiconductor device into the electric circuit board for implementing the electrical power saving apparatus; means for limiting oscillation that is disposed in a optical energy passing cable between the electric cable and an output terminal of the semiconductor device to make the frequency of the square wave output signal equal to the frequency of the AC power; and means for emitting infrared light that is disposed near the semiconductor device to emit infrared light on the semiconductor device with being controlled by the means for controlling, wherein the means for emitting infrared light is to irradiate infrared ray on the semiconductor device during the operating time of the electrical power saving apparatus so that the optical energy of infrared ray is continuously provided to the semiconductor device.

In accordance with still another embodiment of the present invention, an electric power saving device using optical energy of an infrared ray synthetic wavelength, the device comprising: means for irradiating a semiconductor device in a controller with the optical energy of the infrared ray synthetic wavelength in a predetermined wavelength range during assembling of the electric power saving device into an electric circuit board so that electrons within the semiconductor device absorbing photons are excited into a conduction band and electrical characteristics within the crystal structure of the semiconductor are changed; means for rectifying an alternating current (AC) of high voltage supplied from the an AC power supply to a direct current (DC) of low constant voltage after assembling of the electric power saving device into the electric circuit board and supplying the low constant voltage to an input terminal of the controller including the semiconductor device excited by the optical energy of the infrared ray synthetic wavelength; means for passing a square wave micro-current output from a first output terminal of the controller to a optical energy passing cable between an output terminal of the semiconductor device and a optical energy passing cable connecting an alternating current (AC) power supply with a load; and means for irradiating the semiconductor device with an infrared ray emitted by an infrared light-emitting device being operated according to a control signal output from a second output terminal of the controller.

In accordance with some other embodiments of the present invention may include, either alone or in any of the possible combinations, the apparatus, structures and methods as substantially shown and described herein.

While the present invention has been described with reference to the particular illustrative embodiments, it is not to be considered as restricted by the embodiments, but by the appended claims, and therefore, it is required to be understood that other modifications and variations may be made to this invention without departing from the substance and scope of the present invention, as those skilled in the art will readily understand. Also, although FIGS. 10 and 11 illustrate the embodiments for the circuit diagram used in single-phase power and load devices, the embodiments may be varied for three-phase power and load devices as outlined in FIG. 13 by those skilled in the art.

Additionally, the invention having been disclosed, a number of variations will now become apparent to those skilled in the art. Whereas the present invention is intended to encompass foregoing preferred embodiments, as well as a reasonable range of equivalents, reference should be made to the appended claims rather than the foregoing discussion of examples in order to assess the scope of the present invention, for which exclusive rights are claimed.

As previously described, there is provided an electric power saving apparatus, according to the present invention, wherein a pulse micro current, along which the light energy of infrared ray synthetic wavelengths is transmitted, is continuously supplied to the transmission line connecting alternating current power and load from the semiconductor device to which the light of infrared ray synthetic wavelengths is irradiated continuously from the infrared ray emitting diode, such that the wavelengths of electrons on the conductor along the transmission line may be lengthened, the spin motions of electrons may be stabilized, the joule heat level may be low, the saving efficiency may be increased, the noise and vibration may be suppressed, and the quantity of power consumption may be reduced by the decrement of electromagnetic waves. Additionally, the electric power saving apparatus of this invention may be made available to the single-phase circuit used for general office and home load devices, and to three-phase circuits used in industrial load devices.

What is claimed is:

1. An electric power saving apparatus, using light energy, having infrared ray synthetic wavelengths connected in parallel with a transmission line connecting an alternating current power supply and a load, and that is provided with a semiconductor device adapted in order to transmit light energy with infrared ray synthetic wavelengths to the transmission line as an output pulse signal; said electric power saving apparatus comprising:

a rectifying part disposed between the alternating current power, and an input terminal of the semiconductor device, for the purposes of rectifying the alternating current into a direct current of low voltage;

a control part, having a circuit adapted to apply a driving voltage at the direct low voltage current of the rectifying part to the semiconductor device, and having the semiconductor device;

an oscillation-limiting part disposed at the carrier circuit between the transmission line connecting the alternating current power and the load, and an output terminal of the semiconductor device, for the purposes of generating the output pulse signal corresponding with a frequency of the alternating current power; and an infrared ray emitting diode, disposed near the semiconductor device in such a manner as to be controlled by the output of the control part, having the semiconductor device mounted on a circuit board constituting the electric power saving apparatus, for the purposes of irradiating the infrared rays emitted therefrom to the semiconductor device, such that while the circuit board constituting the electric power saving apparatus is being assembled, the light energy from the infrared ray synthetic wavelengths of a specific wavelength band is irradiated to the semiconductor device in order to excite photon-absorbing electrons to a conduction band, and to vary the electrical state in the interior of the crystal of the semiconductor device; and while the electric power saving apparatus is in operation after being connected in parallel with the transmission line connecting the alternating current power and the load, the infrared ray energy is continuously supplied to the semiconductor device.

2. The electric power saving apparatus, according to claim 1, wherein the rectifying part comprises a TNR circuit, a noise filter, and a constant voltage circuit with a zener diode.

3. The electric power saving apparatus, according to claim 1, wherein the oscillation-limiting part comprises a resistor, a condenser, and a zener diode.

4. The electric power saving apparatus, according to claim 1, further comprising a current state display part with a current transformer for reducing and detecting the size of the current applied to the electric power saving apparatus, at a given ratio, and a liquid crystal display for displaying the size of the current detected by the current transformer.

5. The electric power saving apparatus, according to claim 1, wherein the infrared ray synthetic wavelengths in a band between 780 mm and 900 mm are irradiated to the semiconductor device.

6. The electric power saving apparatus, according to claim 5, wherein the infrared ray synthetic wavelengths are irradiated to the semiconductor device prior to the semiconductor device being packaged.

7. The electric power saving apparatus, according to claim 5, wherein the infrared ray synthetic wavelengths of the band between 780 mm and 900 mm are obtained by the formation of infrared ray eddy currents, by way of an infrared ray screw between the visible light of a band between 500 mm and 600 mm, obtained by adjusting the light strength by using a visible light filter, and the infrared rays of a band between 1,000 mm and 10,000 mm, obtained by adjusting the light strength by using an infrared ray filter.

8. The electric power saving apparatus, according to claim 1, wherein the semiconductor device is developed by selecting oxide, sulfide, selenide, telluride, halide, etc.

9. The electric power saving apparatus, according to claim 1, wherein the semiconductor device is comprised of a PLZT with a chemical equation of $(Pb_{1-x}La_x)(Zr_{1-y}Ti_y)_{1-x/4}O_3$.

10. The electric power saving apparatus, according to claim 1, wherein the semiconductor device is packaged with a ceramic material.

11. The electric power saving apparatus, according to claim 1, wherein the semiconductor device is comprised of a programmable microcontroller, having the logic of being able to select the size of the pulse current outputted to the transmission line connecting the alternating current power and the load, and the logic of controlling the light-emitting timing of the infrared ray emitting diode.

12. The electric power saving apparatus, according to claim 1, wherein a switch and a light emitting diode are connected additionally to the semiconductor device, for the purposes of checking whether the semiconductor device is operating normally or not by the application of a driving voltage applied separately prior to the connection of the alternating current power.

13. The electric power saving apparatus, according to claim 12, wherein after the infrared ray emitting diode is assembled on the circuit board for the electric power saving apparatus, the light energy from the infrared ray synthetic wavelengths of the specific wavelength band is irradiated additionally to the infrared ray emitting diode.

14. The electric power saving apparatus, according to claim 12, wherein the infrared ray synthetic wavelengths with bands between 780 mm and 1100 mm are irradiated to the infrared ray emitting diode.

15. The electric power saving apparatus, according to claim 14, wherein the infrared ray synthetic wavelengths with bands between 780 mm and 900 mm are irradiated to the infrared ray emitting diode.

16. The electric power saving apparatus, according to claim 15, wherein the infrared ray synthetic wavelengths of the band between 780 mm and 900 mm are obtained by the formation of infrared ray eddy currents, created by an infrared ray screw between the visible light of a band between 500 mm and 600 mm obtained by adjusting the light strength by using a visible light filter and the infrared rays of a band between 1,000 mm and 10,000 mm, obtained by adjusting the light strength with the use of an infrared ray filter.

17. The electric power saving apparatus, according to claim 1, wherein prior to the infrared ray emitting diode being assembled on the circuit board for the electric power saving apparatus, the light energy from the infrared ray synthetic wavelengths of the specific wavelength band is irradiated to the infrared ray emitting diode in order to excite photon-absorbing electrons to a conduction band and to vary the electrical state in the crystal interior thereof.

18. The electric power saving apparatus, according to claim 1, wherein after the infrared ray emitting diode is assembled on the circuit board for the electric power saving apparatus, the light energy from the infrared ray synthetic wavelengths of the specific wavelength band is irradiated to the infrared ray emitting diode in order to excite photon-absorbing electrons to a conduction band and to vary the electrical state in the crystal interior thereof.

19. A circuit board structure for use in an electric power saving apparatus connected in parallel with a transmission line connecting an alternating current power and a load, said electric power saving apparatus including a control part and a semiconductor device adapted to transmit light energy with the infrared ray synthetic wavelengths to the transmission line as an output pulse signal, said circuit board structure comprising: an infrared ray emitting diode disposed near the semiconductor device in such a manner as to be controlled by the output of the control part having the semiconductor device mounted on a circuit board constituting said electric power saving apparatus, for the purposes of irradiating the infrared rays emitted therefrom to the semiconductor device, such that while the circuit board for the electric power saving apparatus having the semiconductor device constituting the control part is being assembled, the light energy from the infrared ray synthetic wavelengths of a specific wavelength band is irradiated to the semiconductor device in order to excite the photon-absorbing electrons to a conduction band and to vary the electrical state in the interior of the crystal of the semiconductor device; and while the electric power saving apparatus is being operated after being connected in parallel with the transmission line connecting the alternating current power and the load, the infrared ray energy emitted therefrom is continuously supplied to the semiconductor device.

20. The circuit board structure, according to claim 19, wherein the infrared ray emitting diode is disposed at the side of the semiconductor device on the same plane as the circuit board where the semiconductor device is placed, having a distance between 4 mm and 10 mm from the side of said semiconductor device.

21. The circuit board structure, according to claim 19, wherein the infrared ray emitting diode is disposed on a different plane from the circuit board where the semiconductor device is placed, having a distance between 5 mm and 10 mm from the top surface of the semiconductor device.

22. The circuit board structure, according to claim 19, wherein the infrared ray emitting diode is disposed near one of the side or the top surface of the semiconductor device, with a visible light emitting diode further disposed near the other.

23. The electric power saving method using light energy emitted from the light of infrared ray synthetic wavelengths, said electric power saving method comprising the steps of:
  1) while a circuit board constituting the electric power saving apparatus is being assembled, there occurs the irradiation of the light energy having the infrared ray synthetic wavelengths of a specific wavelength band to the semiconductor device in order to excite the photon-absorbing electrons to a conduction band and to vary the electrical state in the interior of the crystal of the semiconductor device;
  2) in a state where the circuit board for the electric power saving apparatus is used after being assembled, rectifying a high alternating voltage current flowing from alternating current power to a low constant voltage, and supplying the low constant voltage to a control part having the semiconductor device excited by the light energy with the infrared ray synthetic wavelengths through input terminals of the control part;
  3) transmitting the pulse of micro currents output from the first output terminal of the control part, to a transmission line connecting the alternating current power and a load in order to supply electric energy and;
  4) irradiating infrared rays generated from an infrared ray emitting diode, and operated by a control signal of the second output signal of the control part to the semiconductor device.

24. The electric power saving method, according to claim 23, wherein steps 3) and 4) are conducted at the same time.

25. The electric power saving method, according to claim 23, wherein at step 4), the light-emitting timing of the infrared ray emitting diodes is controlled by the semiconductor device.

26. The electric power saving method, according to claim 23, wherein step 2) further comprises the step of reducing and detecting the size of the current applied to the electric power saving apparatus at a given ratio, and displaying the detected size of the current to the outside.

* * * * *